United States Patent [19]
Robinett

[11] Patent Number: 5,879,573
[45] Date of Patent: Mar. 9, 1999

[54] METHOD FOR OPTIMIZING A GAP FOR PLASMA PROCESSING

[75] Inventor: Christopher T. Robinett, San Antonio, Tex.

[73] Assignee: VLSI Technology, Inc., Del.

[21] Appl. No.: 909,660

[22] Filed: Aug. 12, 1997

[51] Int. Cl.[6] .................................................. C23F 1/02
[52] U.S. Cl. .............................. 216/59; 216/71; 216/67; 438/710; 438/729; 204/298.32; 204/192.13; 204/192.33
[58] Field of Search .................................. 156/345 P, 64, 156/345 MT; 216/59, 71, 67; 204/298.32, 192.13, 192.33; 438/710, 729

[56] References Cited

U.S. PATENT DOCUMENTS

| | | | |
|---|---|---|---|
| 3,280,016 | 10/1966 | Bass | 204/143 |
| 4,578,559 | 3/1986 | Hijikata | 219/121 PE |
| 4,654,106 | 3/1987 | Davis | 156/345 |
| 5,110,437 | 5/1992 | Yamada | 204/298.33 |
| 5,354,413 | 10/1994 | Smesny | 156/627 |
| 5,413,673 | 5/1995 | Fujimoto | 156/345 P |
| 5,584,933 | 12/1996 | Saito | 118/723 |

*Primary Examiner*—Robert Kunemund
*Attorney, Agent, or Firm*—Burns, Doane, Swecker & Mathis LLP

[57] ABSTRACT

An optimal gap is determined between a lower electrode and an upper electrode in a plasma processing device. A gap is set between the lower electrode and the upper electrode, and a substrate is processed in the plasma processing chamber. The processing results are obtained, and the processing rate and uniformity are determined from the processing results. The processing rate and uniformity are plotted with the gap setting. The steps of setting, processing, obtaining, determining, and plotting are repeated for additional substrates, the gap setting being different for each substrate. The optimal gap setting is selected as the gap setting corresponding to an optimal processing rate and an optimal uniformity.

11 Claims, 4 Drawing Sheets

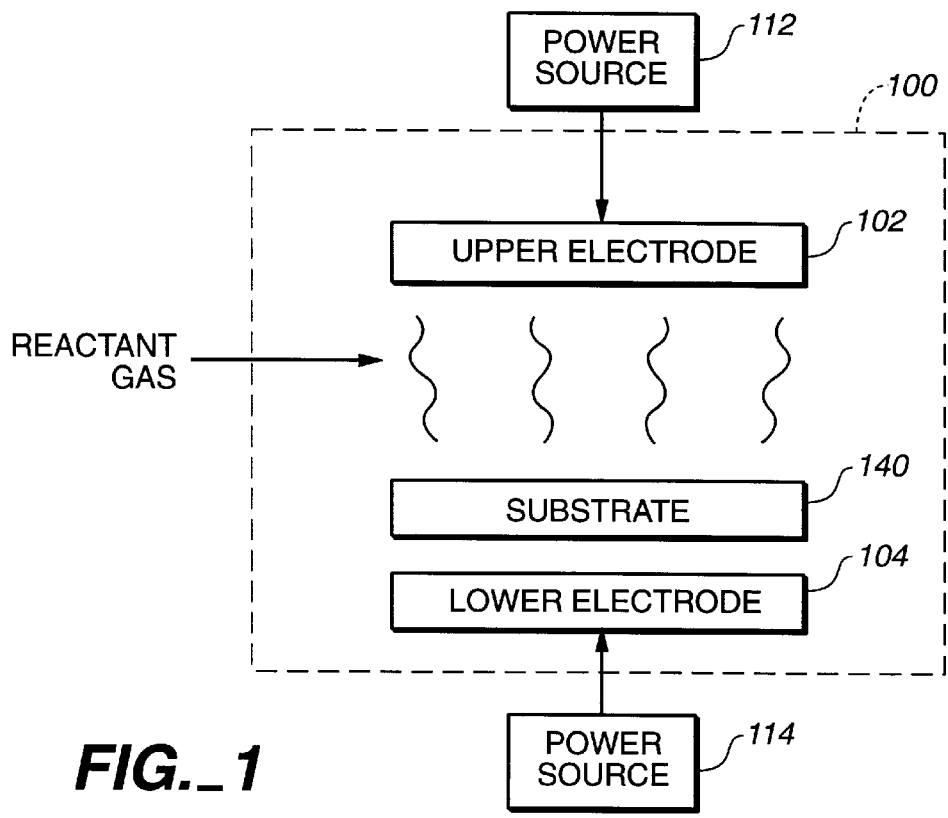
FIG._1
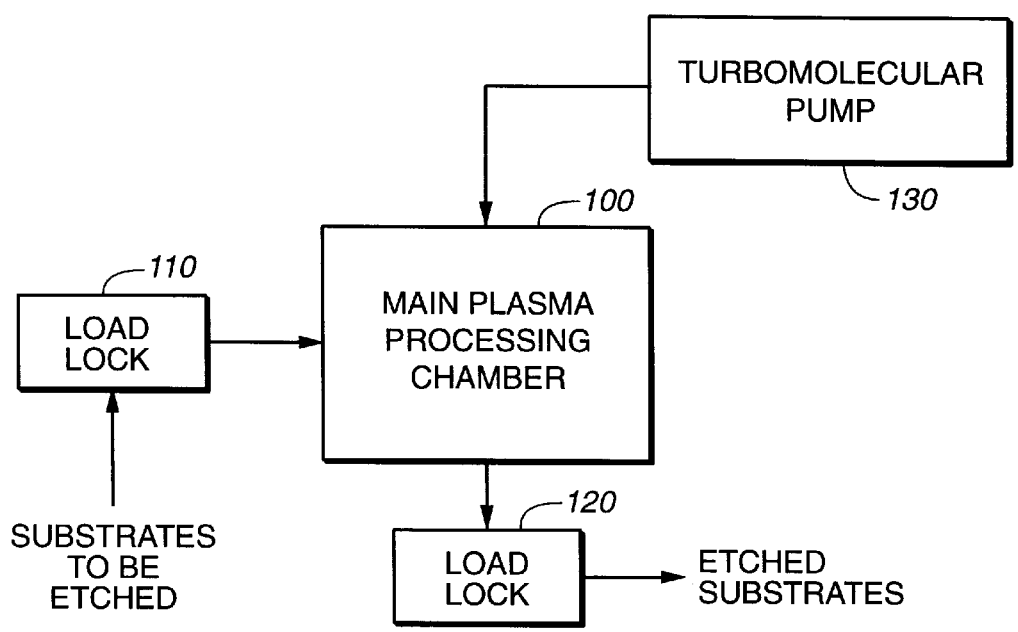
FIG._2

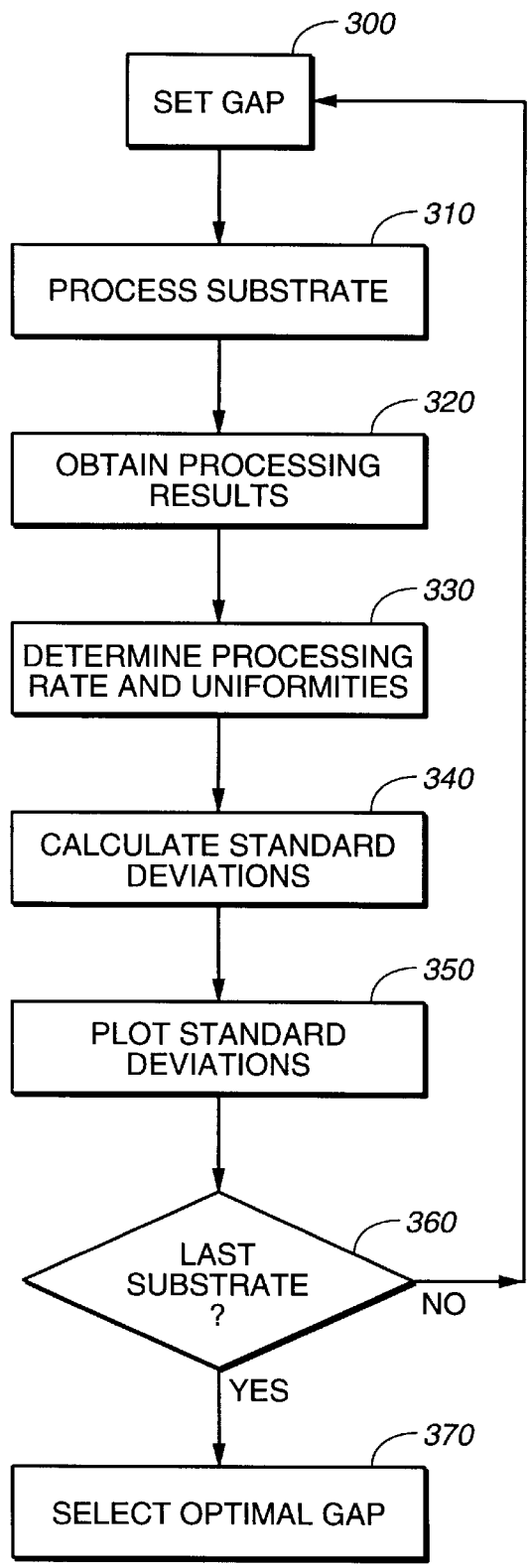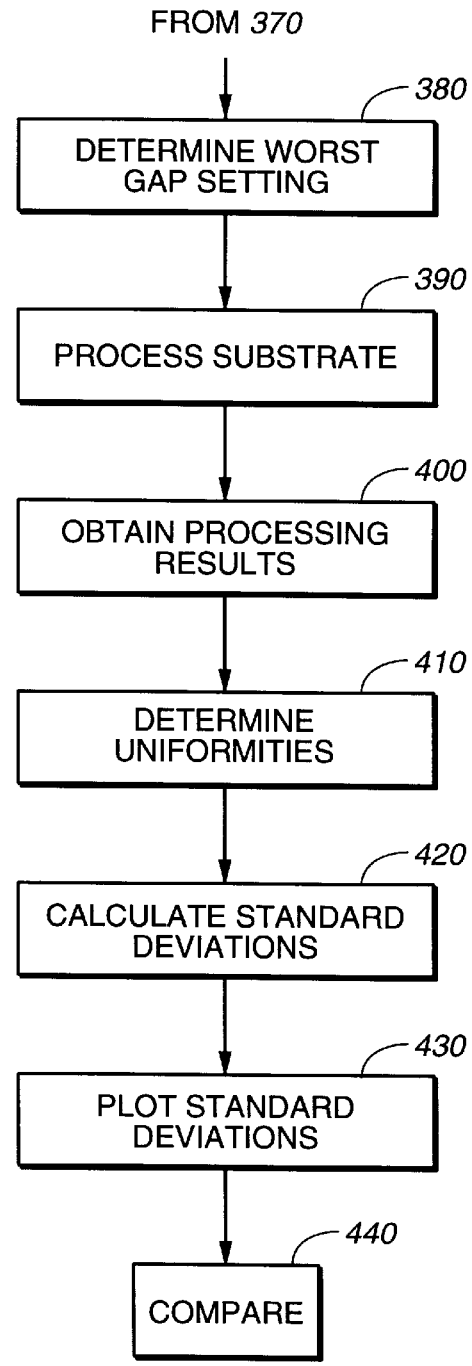
*FIG._3A*  *FIG._3B*

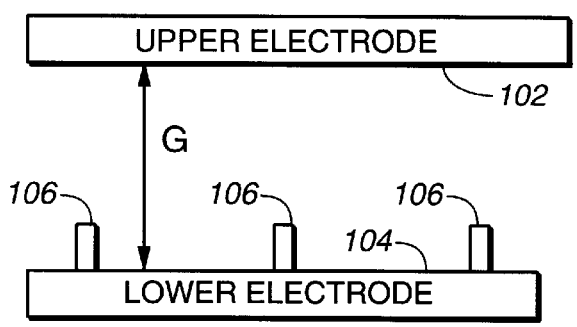
FIG._4
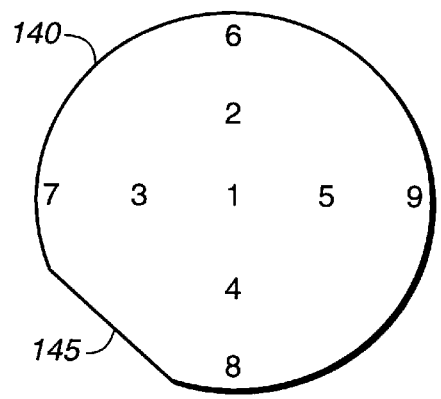
FIG._5
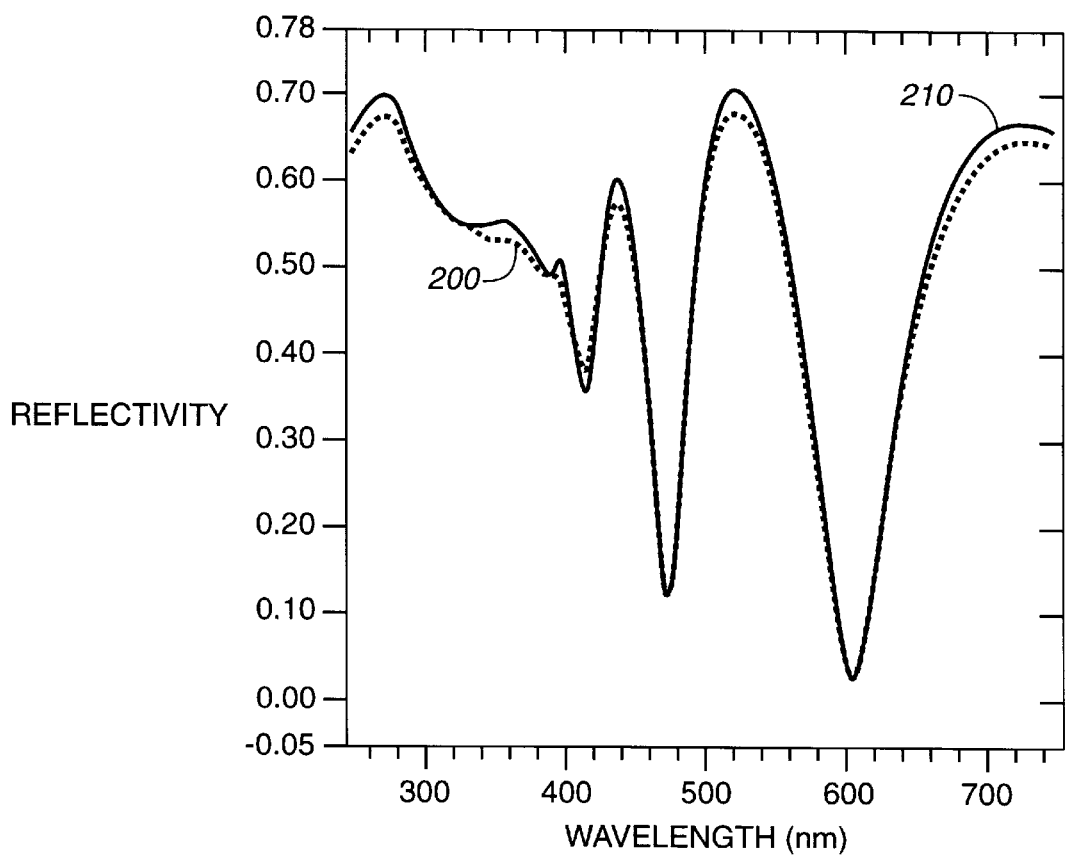
FIG._6

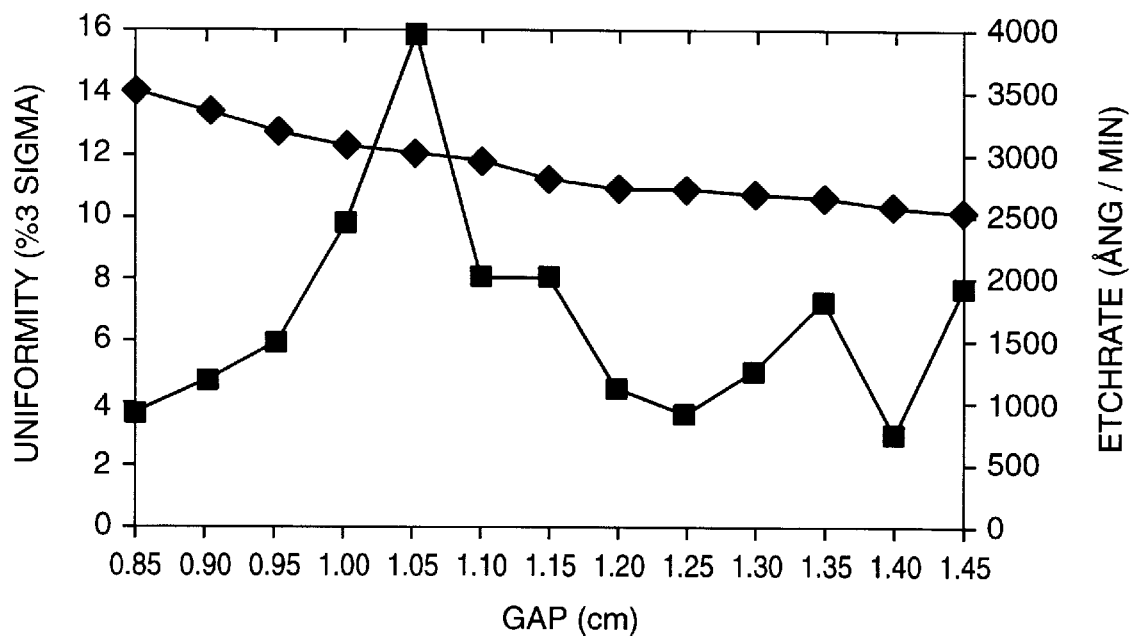
FIG._7A
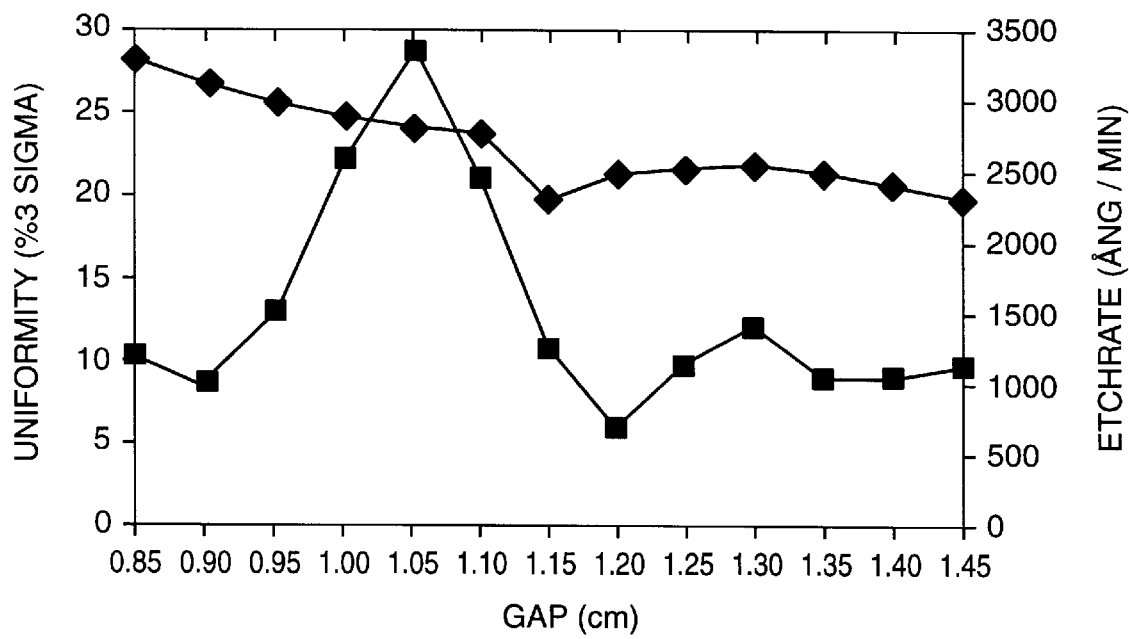
FIG._7B

METHOD FOR OPTIMIZING A GAP FOR PLASMA PROCESSING

BACKGROUND OF THE INVENTION

1. Field of the Invention

The present invention relates to a method for optimizing plasma processing. More particularly, the present invention relates to a method for optimizing a gap for plasma processing to improve processing uniformity and throughput.

2. State of the Art

Plasma processing devices are widely used for chemical vapor deposition of materials on substrates and etching of substrates by supplying process gas to a plasma processing chamber and applying a radio frequency (RF) field to the gas. As shown in FIG. 1, a typical plasma processing device includes a chamber 100 enclosing a lower electrode 104, which supports a substrate 140, and an upper electrode 102. The lower electrode 104 is powered by an RF power source 114, and the upper electrode 102 is powered by an RF power source 112. Reactant gas supplied into the processing chamber is excited into a plasma by RF power applied through the electrodes 102 and 104, and the excited plasma causes deposition and/or etching on the substrate 140. Substrates typically processed in such a device include semiconductor wafers and flat panel displays.

Examples of a plasma processing device include the LAM 4420 Polyetcher, which employs a mechanical clamp to hold the substrate on the lower electrode, and the LAM 4420XL Polyetcher, which employs an electrostatic chuck (ESC) to hold the substrate in place via an electrostatic field.

It is important to maximize yield and throughput in a plasma processing device. Various processing parameters affect yield and throughput, including processing pressure. Plasma processing devices often include turbomolecular pumps used in combination with load locks to maintain a desired pressure for the plasma processing chamber. For example, FIG. 2 illustrates a turbomolecular pumped plasma processing device. Referring to FIG. 2, the turbomolecular pumped plasma processing device includes a main plasma processing chamber 100, load locks 110 and 120, and a turbomolecular pump 130. Substrates are input into the load lock 110, processed through the main chamber 100, and output through the load lock 120. The load locks 110 and 120 employ dedicated pumps to increase the substrate transfer time into and out of the main plasma processing chamber 100, thus optimizing throughput of the plasma processing device. The turbomolecular pump 130 allows lower operating pressures at higher pumping rates which not only complements throughput but also allows a wider range of possible pressure settings for plasma processing. Thus, turbomolecular pumped plasma processing devices have proven effective for improving yield and enhancing throughput.

Another processing parameter affecting throughput and yield in a plasma processing device is the gap between the upper electrode and the lower electrode. Different gap settings result in different concentrations of excited plasma above the substrate. Thus, the processing rate, and hence the throughput, vary depending on the gap setting. The concentration of excited plasma can also vary across the surface of the substrate, depending on the gap setting. Therefore, the gap setting also affects processing uniformity, therefore affecting the yield.

Conventionally, gaps are set to optimize the processing rate, without concern for uniformity. Since the best gap setting for the processing rate can not be the best gap setting for uniformity, this conventional method of setting the gap does not produce an optimal yield.

In addition to processing pressure and the gap between the upper electrode and the lower electrode, there are other factors that affect processing yield and throughput, including processing gas flow and RF power. If the plasma processing device is not producing sufficient yield or not operating at an acceptable throughput, the problem can be that one of the processing parameters is not properly set. Often, it is difficult to determine which parameter is not set properly.

There is thus a need for a method to determine an optimal gap that provides both improved uniformity and throughput. There is also a need for a method for determining if a gap in a plasma processing device is properly set.

SUMMARY OF THE INVENTION

According to the present invention, a method for determining an optimal gap between a lower electrode and an upper electrode in a plasma processing device is provided. A gap is set between the lower electrode and the upper electrode, and a substrate is processed in the plasma processing chamber. The processing results are obtained, and a processing rate and uniformity are determined from the processing results. The processing rate and uniformity are plotted with the gap setting. The steps of setting, processing, obtaining, determining, and plotting are repeated for additional substrates, the gap setting being different for each substrate. The optimal gap setting is selected from the step of plotting as the gap setting corresponding to an optimal processing rate and an optimal uniformity.

BRIEF DESCRIPTION OF THE DRAWINGS

The present invention can be further understood with reference to the following description and the appended drawings, wherein like elements are provided with the same reference numerals. In the drawings:

FIG. 1 illustrates a typical plasma processing chamber;

FIG. 2 illustrates a typical turbomolecular pumped plasma processing device;

FIGS. 3A and 3B illustrate an exemplary method for optimizing a gap according to the present invention;

FIG. 4 illustrates an exemplary gap setting tool;

FIG. 5 illustrates an exemplary measurement layout on a substrate according to the present invention;

FIG. 6 illustrates an exemplary spectral analysis of a measurement location and a modeled film; and FIGS. 7A and 7B illustrate exemplary plots of uniformities and processing rates for various gap settings using different plasma processing devices according to the present invention.

DETAILED DESCRIPTION OF THE PREFERRED EMBODIMENTS

According to the present invention, an optimal gap setting in a plasma processing device is determined based on uniformity of processing and processing rates. By improving the processing rate, the throughput of the plasma processing device is increased. By improving the uniformity, the yield is increased.

FIG. 3A illustrates an exemplary method for optimizing a gap in a plasma processing device according to the present invention. Referring to FIG. 3A, a gap is set at step 300. The gap can be set with any conventional gap setting tool, such as that shown in FIG. 4. Next, a substrate is processed at step 310, and the processing results are obtained for various locations on the substrate at step 320. The processing results can be obtained, for example, by comparing the thickness of a top layer of the substrate before processing and the thickness of the top layer of the substrate after processing. The measurement of thicknesses of the top layer of a substrate is described in more detail below with respect of FIGS. 5 and 6.

At step 330, processing rates and uniformities for the various locations on the substrate are determined from the processing results. At step 340, the standard deviations of the uniformities and processing rates are obtained. The standard deviations are plotted on a graph with the gap setting at step 350. This is described in more detail below with reference to FIGS. 7A and 7B.

Next, at step 360, a determination is made whether the last substrate in the set of substrates to be used for setting an optimal gap has been processed. If not, the method returns to step 300. If the last substrate has been processed, the method proceeds to step 370 at which an optimal gap setting corresponding to an optimal processing rate and an optimal uniformity is selected from the graph.

The method illustrated in FIG. 3A can be used, for example, in an initial set up process. Optimization of a gap can also be useful after the device has been set up, to determine, for example, whether the gap is still properly set. The gap setting can be off for a number of reasons, for example, because the upper electrode and the lower electrode have been replaced or cleaned. The method illustrated in FIG. 3A can be extended to determine whether a gap is properly set, keeping other processing parameters, such as the gas flow, RF power, and the processing pressure constant.

FIG. 3B illustrates a method for determining if a gap is properly set. The method for determining if a gap is properly set begins after step 370 in FIG. 3A. As shown in FIG. 3B, the method proceeds from step 370 to step 380 at which a worst gap setting corresponding to a worst uniformity, i.e., a gap setting having a highest standard deviation in uniformity, is selected from the graph. Next, at step 390, another substrate is processed at the worst gap setting. At step 400, the processing results are obtained for various locations on the substrate. At step 410, the uniformities at various locations on the other substrate are determined. At step 420, a standard deviation of the uniformities is calculated. The standard deviation is plotted at step 430. At step 440, the uniformities at the worst gap setting in the graphs are compared. If the uniformities are substantially the same, the gap setting is determined to be properly set.

FIG. 4 illustrates a typical tool for setting a gap G between a bottom surface of the upper electrode 104 and a top surface of the lower electrode 102. The upper electrode 102 is lowered until it contacts the prongs 106 on the lower electrode 104. The prongs 106 have sensors which detect the contact with the upper electrode 102. The prongs have a definite fully extended length of, for example, up to 5 cm. The gap G is set by lowering the upper electrode 102, pushing the prongs 106 down toward the lower electrode 104 by a desired amount. Using this tool, the gap G can be set to any desired amount. The tool shown in FIG. 4 is shown as an example for setting a gap, and any tool can be used to set the gap G to a desired amount.

The gap measurement tool can also be useful for measuring the uniformity of the gap G. The distance between the lower electrode 104 and the upper electrode 102 can vary across the surface of the lower electrode because, for example, the upper electrode can be tilted. By distributing multiple prongs 106 across the surface of the lower electrode 104, differences in the gap G across the surface of the lower electrode 104 can be measured.

According to the present invention the method of optimizing a gap is applicable to deposition and etching plasma processing devices. In the interest of simplicity, however, the following description refers to an etching device.

FIG. 5 illustrates an exemplary measurement layout on a substrate. As shown in FIG. 5, measurements of processing results can be made at nine locations on a substrate, numbered 1–9. In an exemplary embodiment, the measurement locations numbered 6–9 are positioned at approximately 3 mm from the edge of a 150 mm substrate. The measurement locations numbered 2–5 are positioned at approximately 37.5 mm from the edge of the substrate. The measurement location numbered 1 is positioned approximately in the center of the substrate. As shown in FIG. 5, the flat 145 of the substrate 140 can be rotated 45 degrees to omit any aberrations in measurement.

According to an exemplary embodiment, the processing results are obtained by measuring the thickness of a top layer of the substrate before the substrate is processed, measuring a thickness of the top layer of the substrate after the substrate is processed, and comparing the measurements.

Measurements of substrates processed in an electrostatic chuck (ESC) plasma processing device are more accurate than measurements of substrates processed in a mechanical clamp plasma processing device. This is because the mechanical clamp plasma processing devices have poor backside helium cooling resulting in an overetching condition at the edge of the substrate. Thus, measurements can be made closer to the edge of the substrate if the substrate is processed in an ESC device. For example, measurements made from substrates processed in mechanical clamp devices require an extended edge exclusion of 10 mm or more compared to measurements made in ESC device, which can be made as close as 3 mm from the substrate edge.

In an exemplary test, 150 mm substrates were processed that contained 1500 Ång of doped, thermally grown PolySi on 400 Ång of thermal oxide on bare silicon. The thickness of the PolySi layer was measured before and after processing. These materials and thicknesses are mentioned only as an example, and the present invention is not limited to application to substrates containing these materials.

The thickness of the top layer of the substrate can be measured by applying, for example, a spectral analysis. FIG. 6 illustrates an exemplary spectral analysis of a location on a substrate that has been processed. The measurement tool used to obtain the PolySi thickness measurements in this example utilized wavelengths ranging from 250 nm to 750 nm.

The reflectivity of the film is obtained throughout the wavelength range resulting in a graphical spectral analysis of the PolySi film over the thermal oxide of the substrate. The film is modeled for measurements made before and after processing to provide the most accurate goodness of fit (GOF) measurements. The GOF is measured by comparing the spectral analysis of each measurement location to the spectral analysis of the modeled film.

FIG. 6 displays two curves in the 250 nm to 750 nm wavelength range. One curve 200 represents the film model, while the other curve 210 represents the spectral analysis of the measurement. As can be seen from FIG. 6, the spectral analysis of the measurement location overshoots the film model at the top of the curve, but at the bottom there is nearly a perfect overlay of the two curves.

According to an exemplary embodiment of the present invention, a plurality of substrates are premeasured as described above. The substrates are processed in the plasma processing device, and the gap setting is modified for each substrate. The post PolySi thicknesses of the substrates are measured, and the mean and uniformity of the delta (loss) is obtained. The processing rate and %3 σ uniformity are calculated from the mean and uniformity of the delta loss. The processing rate and %3 σ uniformity are then plotted on a graph with the gap setting.

FIGS. 7A and 7B illustrate exemplary plots of processing rates and uniformities for various gap settings using different plasma processing devices. FIG. 7A illustrates plots obtained for substrates processed in a LAM 4420XL Polyetcher, and FIG. 7B illustrates plots obtained for substrates processed in a LAM 4420 Polyetcher.

Referring to FIGS. 7A and 7B, the uniformity and the etch rate are represented along the vertical axes and the gap setting is represented along the horizontal axis. The uniformity is represented by the line with superposed squares, and the etch rate is represented by the line with superposed diamonds.

To establish the optimal gap setting, gap settings having an optimal uniformity are selected. Using 7%3 σ as an optimal uniformity, three candidates for a gap setting can be selected from the graph shown in FIG. 7A.

Referring to FIG. 7A, the gap setting with the best uniformity is 1.4 cm. This gap setting corresponds to a uniformity deviation of 3%3 σ. The etch rate at this gap setting is approximately 2550 Ång/Min. Thus, this gap setting offers low throughput. In addition, this gap setting suffers from a wide latitude in uniformity when compared to gap settings close to it. As shown in FIG. 7A, the 1.35 cm and 1.45 cm gap settings result in a uniformity deviation of approximately 8%3 σ, compared to the uniformity deviation of 3%3 σ that is achieved by the 1.4 cm gap setting. This wide latitude in uniformity is undesirable because it means that if the gap setting is a small amount off from the desired setting, the processing uniformity will be affected adversely by a significant amount. If throughput and latitude were not an issue, the 1.4 cm gap setting would be the most preferable, in terms of uniformity.

Another gap setting with optimal uniformity is 1.25 cm. The uniformity deviation at this setting is approximately 4%3 σ. Increasing the gap setting to 1.3 cm or reducing the gap setting to 1.2 cm results in a slightly greater uniformity deviation. The increase in etch rate from the 1.4 cm gap to the 1.25 cm gap is approximately 100 Ång/min. This higher etch rate provides a 7.7% throughput increase during the main etch step of the process when compared to the 1.4 cm gap setting.

A gap setting of 0.9 cm offers a uniformity of approximately 5%3 σ with an etch rate of about 3500 Ång/min. Thus, the a 0.9 cm gap setting offers an increase in throughput of 30% compared to the 1.4 cm setting and an increase in throughput of 24% compared to the 1.25 cm gap setting. Because the gap setting of 0.9 cm offers an optimal uniformity and the greatest throughput, this gap is selected as the optimal gap for uniformity and throughput. This gap setting can be used, for example, in the initial set up of the plasma processing device.

Although, in the embodiment described above, gap setting candidates having an optimal uniformity are selected before selecting a gap setting having an optimal etch rate, the invention is not so limited. Alternately, gap setting candidates having an optimal etch rate can be selected first, and then the gap setting having the optimal uniformity can be selected.

Another important aspect of the uniformity and processing rate plots shown in FIGS. 7A and 7B is the signature of the plots. The peaks and low points in the plots constitute the profile of the process and the plasma processing device. As shown in FIGS. 7A and 7B, the processing rate and uniformity plots obtained for substrates processed in two different devices have substantially the same peaks and low points. Thus, the determination of an optimal gap setting need only be made once for a number of different plasma processing devices.

The method according to the present invention can be used to monitor, qualify, or improve process throughput, and this advantage is not only limited to Poly Etch processes. For example, although described with reference to the LAM 4420 and the LAM 4420XL Polyetchers, the present invention is applicable to any type of plasma processing device with a variable gap setting. Other examples of plasma processing devices to which the invention is applicable include the LAM 9000 Metal Etcher, the LAM 4500 Oxide Etcher, the Applied 5000 Etcher, and etchers manufactured by Mattson Technologies, Tegal, and Hitachi.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for optimizing a gap between a lower electrode and an upper electrode in a plasma processing device, the method comprising the steps of:

setting a gap between the lower electrode and the upper electrode;

processing a substrate;

obtaining processing results;

determining from the processing results a processing rate and uniformity;

plotting the processing rate and uniformity with the gap setting;

repeating the steps of setting, processing, obtaining, determining, and plotting for additional substrates, the gap setting being different for each substrate; and selecting an optimal gap setting from said plotted processing rates, uniformities, and gap settings as a gap setting having an optimal processing rate and an optimal uniformity.

2. The method of claim 1, wherein the step of obtaining comprises obtaining processing results at various locations on the substrate.

3. The method of claim 2, wherein the step of determining comprises determining from the processing results processing rates and uniformities at the various locations on the substrate.

4. The method of claim 3, further comprising a step of calculating standard deviations of the processing rates and uniformities, wherein the step of plotting comprises plotting the standard deviations.

5. The method of claim 1, further comprising the step of measuring a thickness of a top layer of the substrate before processing the substrate and measuring the thickness of the top layer of the substrate after processing, wherein the step of obtaining includes comparing the thickness of the top layer before processing to the thickness of the top layer after processing.

6. The method of claim 1, wherein the step of selecting comprises:

selecting gap settings from the graph which correspond to an optimal uniformity; and out of these gap settings, selecting a gap setting which corresponds to an optimal processing rate.

7. The method of claim 1, further comprising the steps of:

determining a worst gap setting corresponding to a worst uniformity;

processing another substrate in the plasma processing device using the worst gap setting;

obtaining processing results;

determining from the processing results a processing uniformity;

plotting the uniformity; and comparing the uniformities at the worst gap setting to determine if the uniformities are substantially the same, wherein if the uniformities are substantially the same, the gap setting is determined to be properly set.

8. The method of claim 1, wherein the process is an etching process.

9. The method of claim 1, wherein the process is a deposition process.

10. The method of claim 1, wherein the steps are performed for setting a gap in an initial set up process.

11. The method of claim 1, wherein the steps are performed for determining if a gap is properly set during plasma processing.

* * * * *